(12) United States Patent
Kondo

(10) Patent No.: US 7,294,936 B2
(45) Date of Patent: Nov. 13, 2007

(54) SEMICONDUCTOR DEVICE

(75) Inventor: Kazuhiro Kondo, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 10/553,466

(22) PCT Filed: Feb. 8, 2005

(86) PCT No.: PCT/JP2005/002196

§ 371 (c)(1),
(2), (4) Date: Oct. 17, 2005

(87) PCT Pub. No.: WO2005/078797

PCT Pub. Date: Aug. 25, 2005

(65) Prior Publication Data

US 2006/0290004 A1    Dec. 28, 2006

(30) Foreign Application Priority Data

Feb. 16, 2004   (JP)  .............................. 2004-038403

(51) Int. Cl.
*H01L 29/40* (2006.01)
(52) U.S. Cl. ..................................... 257/777; 257/686
(58) Field of Classification Search ................ 257/686, 257/777, 778
See application file for complete search history.

(56) References Cited

U.S. PATENT DOCUMENTS 5,805,865 A * 9/1998 Mimura et al. ................ 703/28
5,821,625 A * 10/1998 Yoshida et al. ............. 257/777

FOREIGN PATENT DOCUMENTS

| JP | 5-109977 | | 4/1993 |
| JP | 05-109977 | * | 4/1993 |
| JP | 08-167703 | * | 6/1996 |
| JP | 10-200062 | | 7/1998 |
| JP | 11-168185 | | 6/1999 |
| JP | 2001-156249 | | 6/2001 |

* cited by examiner

*Primary Examiner*—Sara Crane
(74) *Attorney, Agent, or Firm*—Oblon, Spivak, McClelland, Maier & Neustadt, P.C.

(57) ABSTRACT

In the case where a first semiconductor chip 100 and a second semiconductor chip 200 are stacked, both the semiconductor chips 100 and 200 are connected using micro bumps, in which a circuit block in the first semiconductor chip and a circuit block in the second semiconductor chip are connected by the micro bumps, and the circuit block in the second semiconductor chip is also connected to the external electrode by the micro bumps through the first semiconductor chip. Further, micro bumps 121, 221 that connect circuit blocks 101, 102, 103, 104 and 210 of both the semiconductor chips 100, 200 and the micro bumps 122, 222 that connect the circuit block 210 in one chip 200 to an external electrode are arranged in different positions.

14 Claims, 6 Drawing Sheets

SEMICONDUCTOR DEVICE

TECHNICAL FIELD

The present invention relates to a semiconductor device formed of a plurality of semiconductor chips stacked.

BACKGROUND ART

The SIP (System in package) technology with which a plurality of semiconductor chips are stacked in three dimensional directions (in the direction of height) to be integrated in one package has been developed. FIGS. 5 and 6 are drawings showing an example of a structure of such semiconductor device of prior art. FIG. 5 shows a cross sectional view and FIG. 6 shows a plan view seen from the above. In this example, a second chip 20 is stacked on a first chip 10, and a memory (DRAM) 11 and others are included in the first chip 10 as an integrated circuit and a CPU (Central Processing Unit) Block 21 and others are included in the second chip 20 as an integrated circuit. Further, the first chip 10 is made to be somewhat larger than the second chip 20.

The memory 11 in the first chip 10 is formed of a plurality of DRAMs; a selector 12 is provided to select from the plurality of DRAMs; and the memory 11 is connected to the CPU block 21 on the second chip 20 side through the selector 12. A selector is also provided on the CPU block 21 side. The details with respect to the structure connected through these selectors are described later; each selector also has a register function that retains data temporarily.

As the structure for connecting the memory 11 and the CPU block 21, as shown in FIG. 6, a pad 13a connected to the selector 12 with the internal wiring is provided on the first chip 10 side and a pad 22a connected to the CPU block 21 with the internal wiring is provided on the second chip 20 side. Then, the pad 13a on the first chip 10 side and the pad 22a on the second chip 20 side are connected with a wire 31 such as a copper wire. Although only one set of the pads 13a, 22a and wire 31 is shown in FIG. 6 to make the explanation simplified, a plurality of those sets are arranged in actuality, in which parallel data can be transferred.

A predetermined number of pads 22b connected to the CPU block 21 with the internal wiring are provided on the second chip 20 side in order to connect the CPU block 21 to the outside. A predetermined number of pads 13b are provided on the first chip 10 side at a position adjacent to each of pads 22b, and further a predetermined number of pads 13c connected to the pad 13b with the internal wiring are provided in the peripheral portion of the first chip 10. Then, the pads 22b on the second chip 20 side and the pads 13b on the first chip 10 side are connected with the wire 31, and the pads 13c in the peripheral portion of the first chip 10 are connected to the electrode on the package side (not shown in the figure) with the wire 32.

Hereupon, FIG. 7 shows an example of a state of prior art in which the CPU block 21 on the second chip 20 side and the memory 11 on the first chip 10 side are connected. In the example of FIG. 7, four DRAMs 11a, 11b, 11c and 11d constitute the memory 11, and each of DRAMs 11a to 11d is connected to the register and selector 12 through the internal wiring in the chip 10. The selector 12 is connected to the register and selector 21a on the CPU block 21 side through the wire 31 connecting the chip 10 and chip 20, and the register and selector 21a is connected to the circuit in the CPU block 21 through the internal wiring.

As shown in FIG. 7, the CPU block 21 side and the DRAMs 11a to 11d side are connected through the registers and selectors 12, 21a, to perform selectively the readout from or writing to the four DRAMs 11a to 11d, and further the readout or writing is performed dividedly in one selected DRAM. For example, in the case where data of originally 128 bits is read or written in parallel in one DRAM, both the selectors 12 and 21a are connected with thirty-two wires, and the readout or writing of 128 bits data is performed four times dividedly.

The above described structure in which a plurality of semiconductor chips are stacked is disclosed in Published Japanese Patent Application No. H8-167703 issued by Japanese Patent Office.

Here, in the structure shown in FIGS. 5 through 7, the CPU block on the first chip 10 and the memory on the second chip 20 are connected through the register and selector, so that the number of the wires 31 (and pads connected to the wires) connecting both the chips 10, 20 is made to be comparatively small and consequently wires connecting two chip components are reduced. If the number of wires increases, it takes time to connect chip components, which is unfavorable. Further, because there is a limit regarding the area on the chip where pads can physically be arranged, the number that can be connected is also restricted.

However, when the writing and readout are dividedly performed with the connection through the selector as described above, there is a problem that it takes time to access the memory. Although it is necessary to increase the transfer rate of data in order to shorten the time required for the access, there are such problems that the distortion is easily caused with respect to the waveform at the high transfer rate due to a large inductance component of the wire portion in the case where the connection was made with the wires and that the undesirable radiation and the power consumption may increase.

Further, in the case where two chips are stacked and connected as described above, only in order to connect the circuit block in one chip to an electrode on the package side, the chip is required to be connected to the other chip component with the wire, and so there is a problem that the connected structure becomes complicated. Specifically, for example, in the example of FIGS. 5 and 6, in order to connect the CPU block 21 on the second chip 20 side to the electrode on the package side, the connection is made to the internal wiring on the first chip 10 side with the pad 22b, wire 31 and pad 13b, and further the connection is made from the pad 13c in the peripheral portion of the first chip 10 to the electrode on the package side with the wire, and so the connected structure becomes complicated. Further, when the wire (part of the wire 31) to connect the CPU block 21 and the electrode on the package side and the wire (part of the wire 31) to connect the CPU block 21 and the memory are arranged adjacently to each other, the influence of the above described undesired radiation is mutually received, which is not preferable in view of characteristics thereof.

The present invention is to provide a semiconductor device in which the connected structure can be simplified and favorable characteristics can be obtained in the case of stacking a plurality of semiconductor chips.

DISCLOSURE OF THE INVENTION

The first aspect of the present invention is a semiconductor device including a first semiconductor chip and a second semiconductor chip stacked, wherein the first semiconductor chip includes a first electrode portion for connecting to the external electrode with wire, a second electrode portion having micro bumps for connecting a circuit in the second semiconductor chip to the first electrode portion, and a third electrode portion having micro bumps for connecting a circuit block in the first semiconductor chip to the circuit in the second semiconductor chip; and the second semiconductor chip includes a fourth electrode portion having micro bumps for connecting to the second electrode portion in the first semiconductor chip, and a fifth electrode portion having micro bumps for connecting to the third electrode portion in the first semiconductor chip.

The second aspect of the present invention is the semiconductor device according to the first aspect of the invention, wherein the second electrode portion in the first semiconductor chip and the fourth electrode portion in the second semiconductor chip are arranged in the vicinity of a peripheral portion on each chip, and the third electrode portion in the first semiconductor chip and the fifth electrode portion in the second semiconductor chip are arranged in the vicinity of the center portion on each chip.

The third aspect of the present invention is the semiconductor device according to the first aspect of the present invention, wherein the first semiconductor chip includes a circuit block of a memory, and the second semiconductor chip includes a circuit block of a control portion.

The fourth aspect of the present invention is the semiconductor device according to the first aspect of the present invention, wherein the micro bumps constituting the third and fifth electrode portions are arranged at least by the number corresponding to the number of bits of a memory which is included in the first semiconductor chip and in which the readout or writing is performed in parallel.

According to the present invention having the above structure, since two semiconductor chips are connected using micro bumps, the two semiconductor chips can be connected easily with a number of terminals. Therefore, in the case where, for example, the circuit block of a memory is provided in the first semiconductor chip and the circuit block of a control portion is provided in the second semiconductor chip and the control portion and the memory are connected, the both chips can be connected by a necessary number of bits for performing the writing to and readout from the memory and the structure can be simplified without providing the selector and others to select the memory.

Further, since the electrode portion where the circuit block in the first semiconductor chip and the circuit block in the second semiconductor chip are connected by the micro bumps and the electrode portion where the other micro bumps than those are used for connection are arranged in the different positions on the chip, it becomes possible to make an arrangement in which the data transfer between the circuit blocks in the two semiconductor chips and the data transfer to the outside of the semiconductor device are performed without interference, and the semiconductor device having favorable characteristics can be obtained.

BEST MODE FOR CARRYING OUT THE INVENTION

Hereinafter, an embodiment of the present invention is explained referring to FIGS. 1 to 4.

Figure 1:
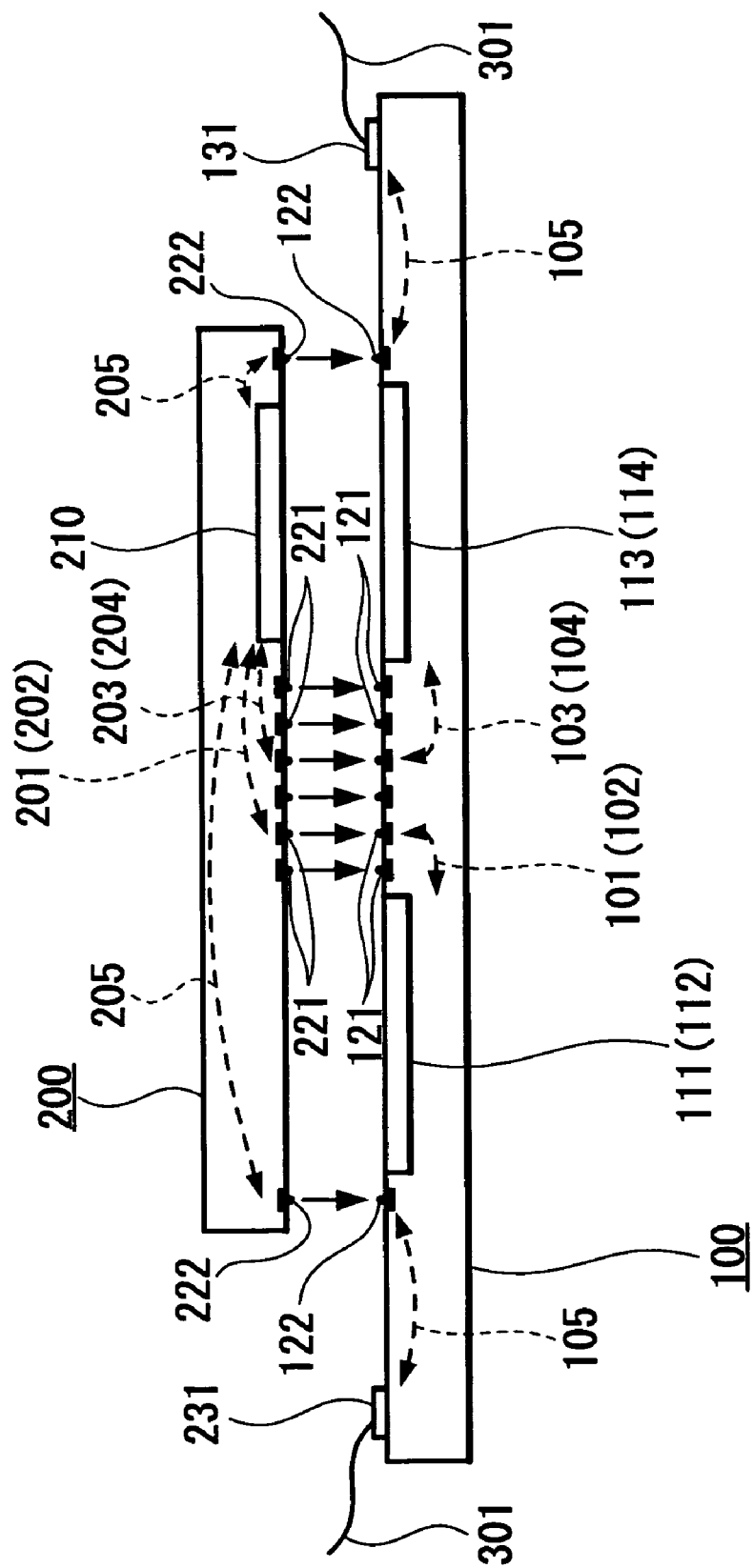
FIG. 1 is a sectional view showing an example of a structure of the vertical section according to an embodiment of the present invention.
Figure 2:
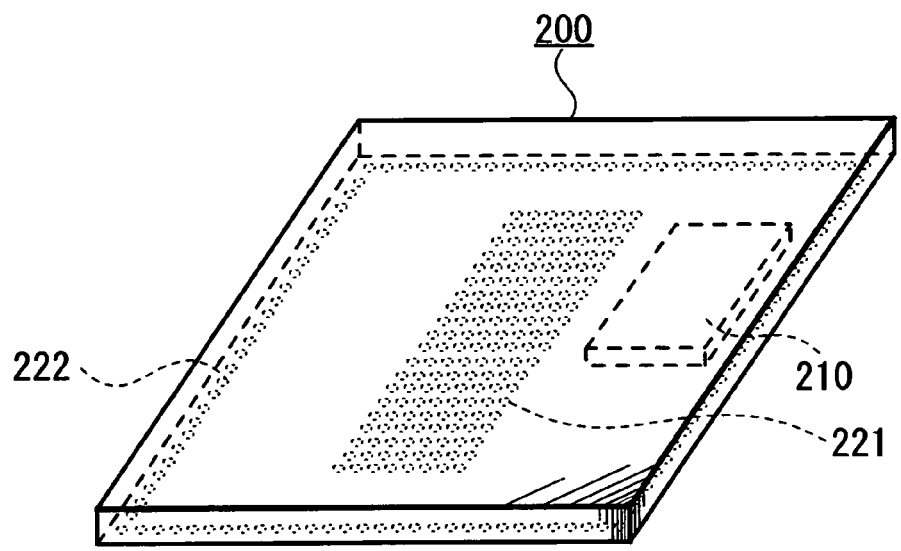
FIG. 2 is a perspective view showing an example of a state before joining according to an embodiment of the present invention.
Figure 2:
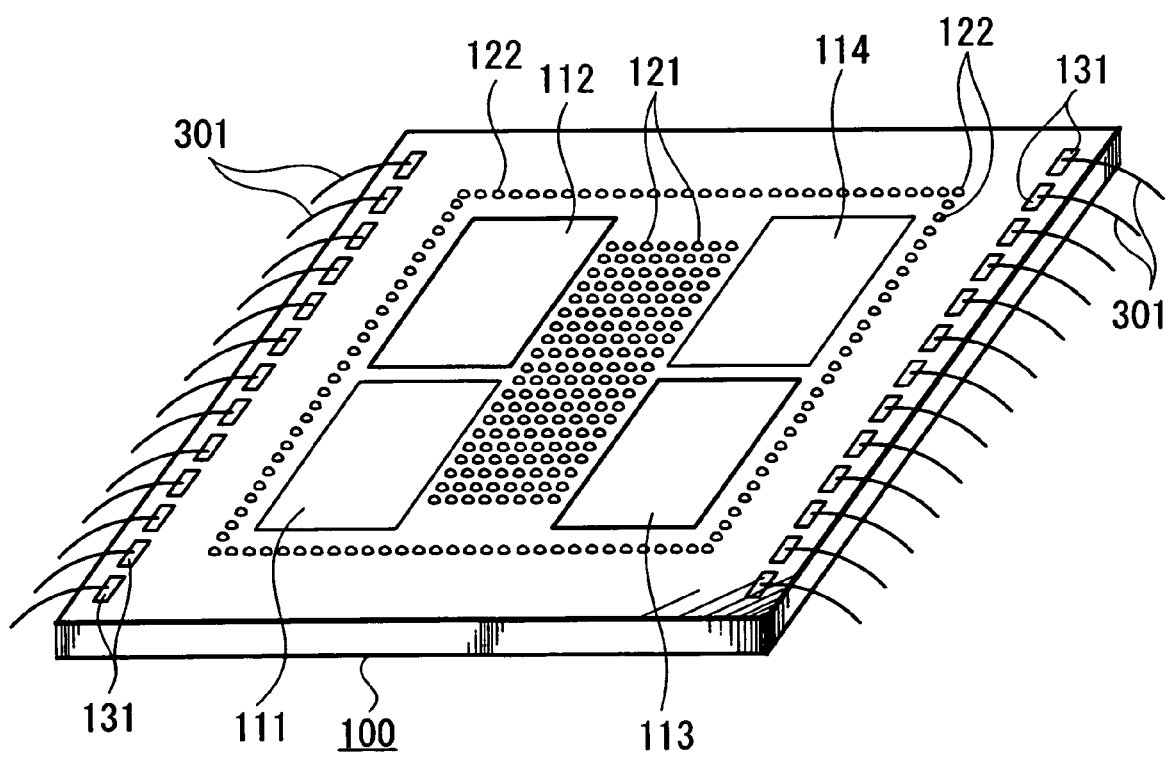

FIGS. 1 and 2 are diagrams showing a structure of a semiconductor device of this embodiment in the state before joining two chips 100 and 200, and FIG. 1 shows a sectional view and FIG. 2 shows a perspective view. Further, FIG. 3 shows the chip 100 upside down from FIG. 2.

In this embodiment, the second chip 200 is stacked on the first chip 100; DRAMs 111, 112 113 and 114 of memories and others are included in the first chip 100 as the integrated circuit; and a CPU (Central Processing Unit) block 210 and others are included in the second chip 200 as the integrated circuit. Further, the first chip 100 is made somewhat larger in size than that of the second chip 200. The four DRAMs 111 to 114 in the first chip 100 are directly connected to the CPU block 210 on the second chip 200 side through the electrodes having a micro bump 121, 221.

A number of electrodes having a micro bump 121 that connect the four DRAMs 111, 112, 113 and 114 in the first chip 100 to the CPU block 210 on the second chip 200 side, as shown in FIG. 2, are arranged almost in the center of the first chip 100 in the matrix shape with a specific pitch.

Figure 3:
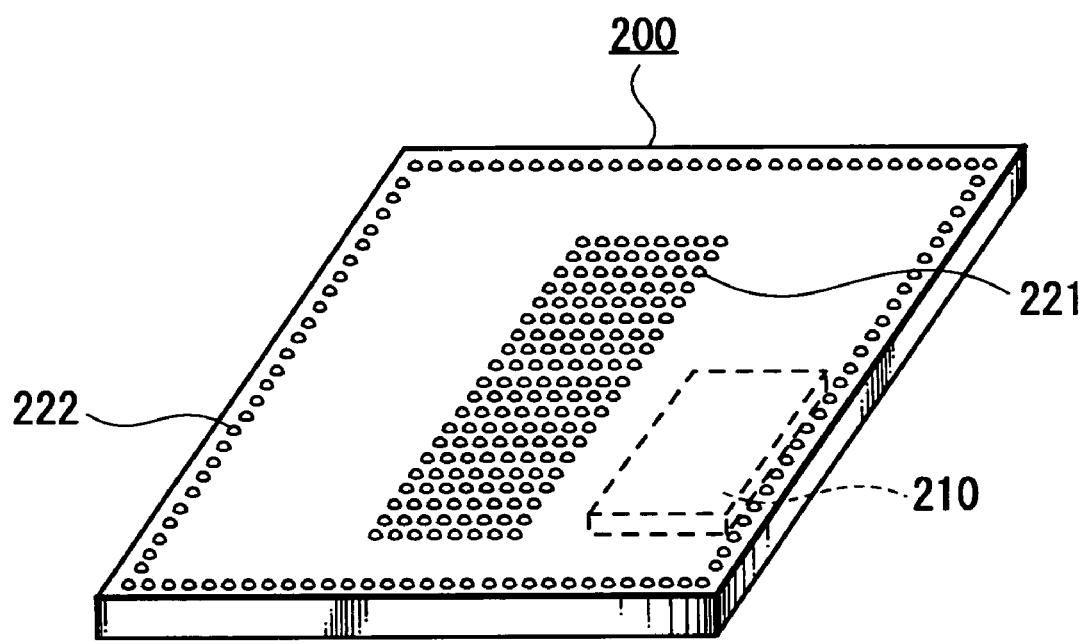
FIG. 3 is a perspective view showing a second chip in the state upside down from FIGS. 1 and 2 according to an embodiment of the present invention.

Further, as shown in FIG. 3, in the center of the second chip 200 are provided the electrodes having a micro bump 221 formed of similar sized convexity of a conductive member of the same number and of the same arrangement as the electrodes 121 in the matrix shape on the first chip 100 side. With respect to the electrodes 121 and 221, one electrode has a bump formed of a convexity of a conductive member of 30 μm in diameter for example, and is plated with SnAg or the like. The other electrodes having a micro bump 122, 222 described later on have the similar structures.

Further, when the second chip 200 is stacked on the first chip 100, the electrodes having a micro bump 121 on the first chip 100 side and the electrodes having a micro bump 221 on the second chip 200 side are precisely positioned to be contacted and then fixing processing such as heating is performed, and consequently the micro bumps mutually contacted are fixed in the state electrically conductive. By fixing in this way, as shown in FIG. 1 for example, the DRAM 111 in the first chip 100 is connected to the CPU block 210 through the internal wiring 101, the electrodes having a micro bump 121, 221 and the internal wiring 201. The DRAM 112 in the first chip 100 is connected to the CPU block 210 through the internal wiring 102, the electrodes having a micro bump 121, 221 and the internal wiring 202. The DRAM 113 in the first chip 100 is connected to the CPU block 210 through the internal wiring 103, the electrodes having a micro bump 121, 221 and the internal wiring 203. The DRAM 114 in the first chip 100 is connected to the CPU block 210 through the internal wiring 104, the electrodes having a micro bump 121, 221 and the internal wiring 204.

In this embodiment, the input bus and output bus for the CPU block 210 and each of DRAMs 111, 112, 113, 114 are individually prepared in the necessary bit width for each DRAM. For example, assuming that the bit width of the bus is 128 bits, 256 bits width in total, namely 128 bits each, is necessary for the input bus and output bus per DRAM, and furthermore, the bus width of 256×4=1024 bits is necessary, because four DRAMs are arranged. Therefore, at least 1024 pieces of the electrodes having a micro bump 121 on the first chip 100 side and at least 1024 pieces of the electrodes having a micro bump 221 on the second chip 200 side are arranged respectively. In actuality, since lines for exchanging control data and the like are also needed, more number of electrodes having a micro bump 121, 221 are arranged.

Further, the CPU block 210 in the second chip 200 is connected through the wire 301 attached to the first chip 100 to the electrode attached to the package (not shown in the figure) which houses the chips 100 and 200, and for this connection, the electrode having a micro bump 222 connected to the CPU block 210 through the internal wiring 205 (refer to FIG. 1) is prepared, for example. This electrode having a micro bump 222, is arranged in the peripheral portion of the second chip 200, as shown in FIG. 3. With respect to this electrode having a micro bump 222, several hundred or more thereof are provided.

Further, the same number of electrodes having a micro bump 122 as the electrodes having a micro bump 222 is arranged at the position on the first chip 100 side that faces the electrodes having a micro bump 222. The electrodes having a micro bump 222 are individually connected to a plurality of pads 131 formed of a conductive member arranged in the peripheral portion on the first chip 100 through the internal wiring 105 (refer to FIG. 1) in the first chip 100. As shown in FIGS. 1 and 2, each of the pads 131 is connected by wire bonding to an electrode (not shown in the figure) on the package side through the individual wire 301, respectively.

At the time when connecting the first chip 100 and the second chip 200 as described above, the electrodes having a micro bump 122, 222 in the peripheral portions on both the chips 100 and 200 are also connected simultaneously.

Figure 4:
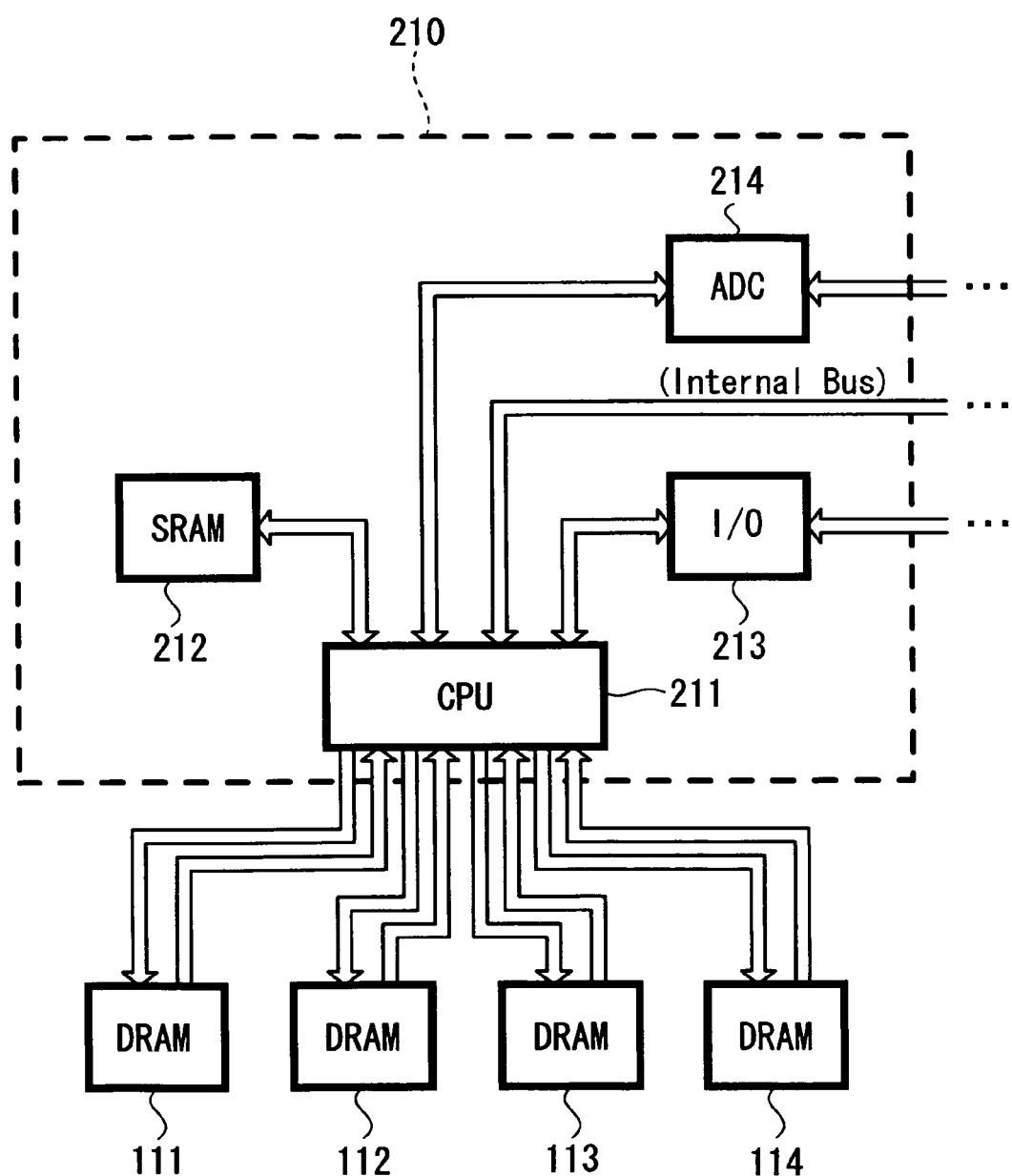
FIG. 4 is a block diagram showing an example of a connection of circuit blocks in a device according to an embodiment of the present invention.
Figure 5:
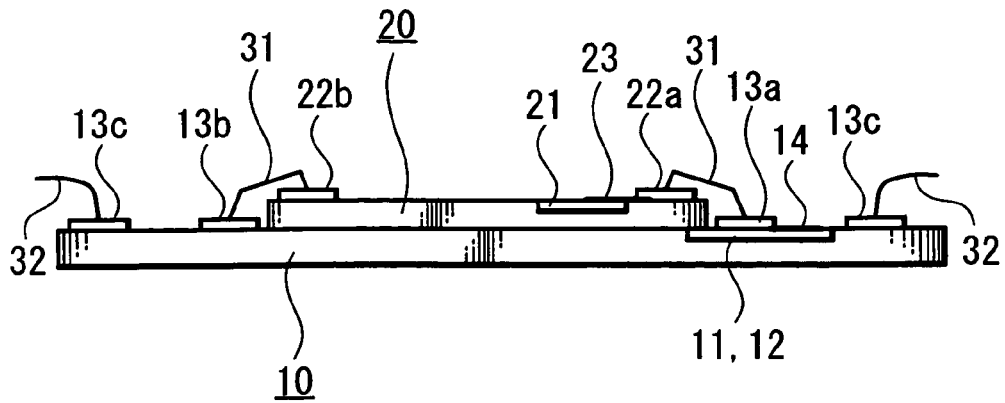
FIG. 5 is a sectional view showing an example of a structure of the vertical section according to prior art.
Figure 6:
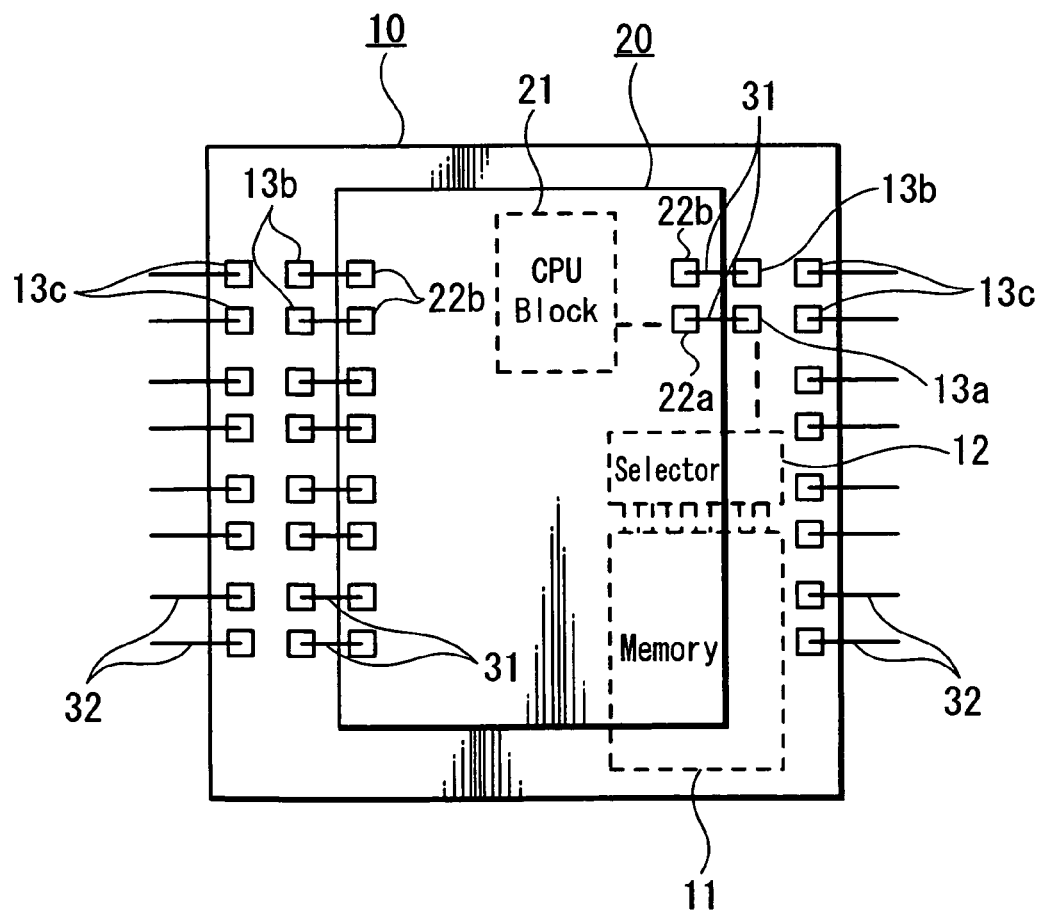
FIG. 6 is a plan view showing an example of a semiconductor device according to prior art.
Figure 7:
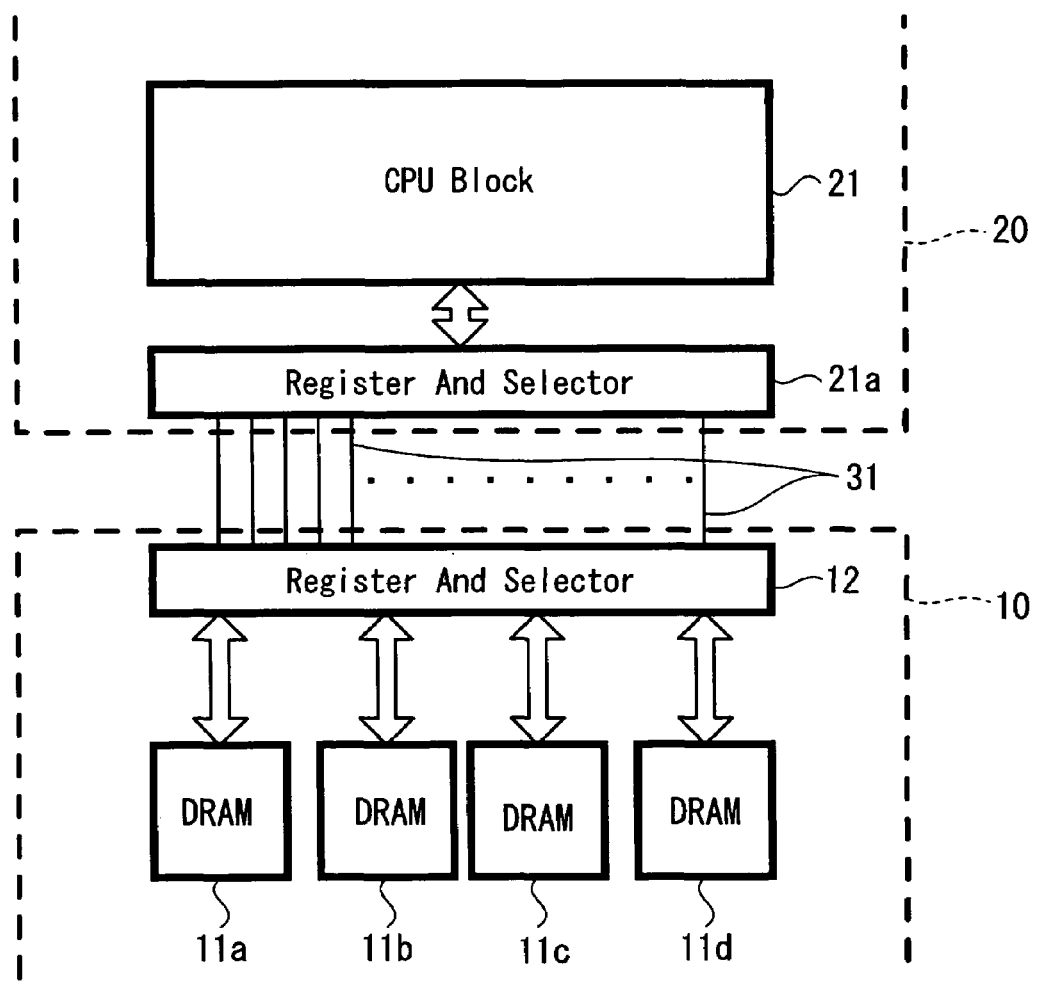
FIG. 7 is a block diagram showing an example of a connection between the blocks in a semiconductor device of prior art.

FIG. 4 is a block diagram of this embodiment showing the state in which circuits are connected between each of DRAMs 111 to 114 in the first chip 100 and the CPU block 210 in the second chip 200. In this embodiment, as explained above, the necessary input bus and output bus (128 bits width respectively, for example) of each of DRAMs 111 to 114 are individually connected to the CPU 211. Therefore, the register and selector needed in the example of prior art shown in FIG. 7 are not necessary, and the CPU 210 can be accessed directly from each of DRAMs 111 to 114.

Further, the CPU block 210 includes an SRAM 212, a data input/output interface 213, an analogue/digital converter 214 and so on, other than the CPU of the control portion, and signal wires such as a bus connected to these circuits in the CPU block 210 are connected to the electrodes on the package side with the necessary bit number through the electrodes having a micro bump 122, 222, the pads 131 and the wires 301.

According to the semiconductor device having the above explained structure of this embodiment, since a plurality of memory elements 111 to 114 in the first chip 100 and the CPU block 210 in the second chip are directly connected by the bit width required for each memory as the input bus and/or the output bus and the connection is not made through the register and selector, the structure for control is simplified and necessary data can be input and/or output directly and therefore the exchange of data between two chips can be performed fast at a comparatively low transfer rate. Further, the power consumption may be suppressed low, because there is no need to make the transfer rate high and no need to provide the selector and the like.

Further, since the electrodes having a micro bump 121, 221 to perform the input/output of data between the memory elements 111 to 114 and the CPU block 210 are arranged in almost the center on each of the chips 100 and 200, and the electrodes having a micro bump 122, 222 to connect the CPU block 210 to the electrodes attached to the package are arranged in the peripheral portion distantly (arranged at different position), the interference between the data exchanged between the CPU block 210 and the memory elements 111 to 114 and the data exchanged between the CPU block 210 and the outside of the package can be prevented and the electrical characteristics as the semiconductor device can be made excellent.

Note that, in the above mentioned embodiment, the DRAM is arranged on the first chip side and the CPU block is arranged on the second chip side, however, these circuit blocks may be each provided in opposite chips. Further, on each chip may be arranged other circuit blocks than the CPU block of the control portion and the DRAM of the memory element, and the circuit blocks between both chips may be connected directly through the micro bumps.

The invention claimed is:

1. A semiconductor device comprising:
a first semiconductor chip including a plurality of memory elements and a second semiconductor chip including a central processing unit (CPU) block stacked,
wherein said first semiconductor chip includes
a first electrode portion for connecting to an external electrode through wiring,
a second electrode portion having micro bumps for connecting said CPU block in said second semiconductor chip to said first electrode portion, and
a third electrode portion having micro bumps for providing a data connection from said memory block in said first semiconductor chip to said CPU block in said second semiconductor chip; and
said second semiconductor chip includes
a fourth electrode portion having micro bumps for connecting to the second electrode portion in said first semiconductor chip, and
a fifth electrode portion having micro bumps for connecting to the third electrode portion in said first semiconductor chip,
wherein the second electrode portion in said first semiconductor chip and the fourth electrode portion in said second semiconductor chip are arranged in a vicinity of a peripheral portion on each chip and the third electrode portion in said first semiconductor chip and the fifth electrode portion in said second semiconductor chip are arranged in a vicinity of a center portion on each chip.

2. The semiconductor device according to claim 1, wherein a number of micro bumps constituting said third and fifth electrode portions is at least a number corresponding to a number of bits of a memory element which is included in said first semiconductor chip and in which a readout or writing is performed in parallel.

3. The semiconductor device according to claim 1, wherein a memory element included in said first semiconductor chip is a DRAM.

4. The semiconductor device according to claim 3, wherein a number of micro bumps constituting said third and fifth electrode portions is at least equal to a bit width of each of an input and an output bus of the DRAM.

5. The semiconductor device according to claim 3, wherein a bit width of each of an input bus and an output bus of the DRAM is 128 bits, and, the number of micro bumps constituting said third and fifth electrode portions is at least 256.

6. The semiconductor device according to claim 1, wherein the first semiconductor chip includes four DRAMS.

7. The semiconductor device according to claim 6, wherein a bit width of each of an input bus and an output bus of each of the four DRAMS is 128 bits, and the number of micro bumps constituting said third and fifth electrode portions is at least 1024.

8. A semiconductor device comprising:
a first semiconductor chip including a plurality of memory elements,
a second semiconductor chip including a central processing unit (CPU) block stacked,
a first electrode configured to connect the first semiconductor chip to an external electrode through wiring,
a second electrode having micro bumps configured to connect said CPU block in said second semiconductor chip to the first electrode,
a third electrode having micro bumps configured to provide a data connection from said memory block in said first semiconductor chip to said CPU block in said second semiconductor chip,
a fourth electrode having micro bumps configured to connect to the second electrode in said first semiconductor chip, and
a fifth electrode having micro bumps configured to connect to the third electrode in said first semiconductor chip, wherein the second electrode in said first semiconductor chip and the fourth electrode in said second semiconductor chip are located in a vicinity of a peripheral portion on each chip, and the third electrode in said first semiconductor chip and the fifth electrode in said second semiconductor chip are located in a vicinity of a center portion on each chip.

9. The semiconductor device according to claim 8, wherein a number of micro bumps constituting said third and fifth electrodes is at least a number of bits of a memory element which is included in said first semiconductor chip and in which a readout or writing is performed in parallel.

10. The semiconductor device according to claim 8, wherein a memory element included in said first semiconductor chip is a DRAM.

11. The semiconductor device according to claim 10, wherein a number of micro bumps constituting said third and fifth electrode portions is at least equal to a bit width of each of an input and an output bus of the DRAM.

12. The semiconductor device according to claim 10, wherein a bit width of each of an input bus and an output bus of the DRAM is 128 bits, and, the number of micro bumps constituting said third and fifth electrode portions is at least 256.

13. The semiconductor device according to claim 8, wherein the first semiconductor chip includes four DRAMS.

14. The semiconductor device according to claim 13, wherein a bit width of each of an input bus and an output bus of each of the four DRANIS is 128 bits, and the number of micro bumps constituting said third and fifth electrode portions is at least 1024.

* * * * *

UNITED STATES PATENT AND TRADEMARK OFFICE
CERTIFICATE OF CORRECTION

| | | |
|---|---|---|
| PATENT NO. | : 7,294,936 B2 | Page 1 of 1 |
| APPLICATION NO. | : 10/553466 | |
| DATED | : November 13, 2007 | |
| INVENTOR(S) | : Kazuhiro Kondo | |

It is certified that error appears in the above-identified patent and that said Letters Patent is hereby corrected as shown below:

Column 1, line 32, change "13$a$connected" to --13$a$ connected--.

Column 1, line 34, change "22$a$connected" to --22$a$ connected--.

Column 1, line 48, change "13$c$connected" to --13$c$ connected--.

Column 1, line 52, change "13$c$in" to --13$c$ in--.

Column 8, line 30, change "DRANIS" to --DRAMS--.

Signed and Sealed this

First Day of July, 2008

JON W. DUDAS
*Director of the United States Patent and Trademark Office*